(12) United States Patent
La Rosa et al.

(10) Patent No.: US 6,282,255 B1
(45) Date of Patent: Aug. 28, 2001

(54) FREQUENCY DIVIDER WITH VARIABLE MODULO

(75) Inventors: Jean-Pierre La Rosa, Garges-les-Gonesse; André Roullet, Domont, both of (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/508,529

(22) PCT Filed: Sep. 29, 1998

(86) PCT No.: PCT/FR98/02088

§ 371 Date: Apr. 3, 2000

§ 102(e) Date: Apr. 3, 2000

(87) PCT Pub. No.: WO99/18669

PCT Pub. Date: Apr. 15, 1999

(30) Foreign Application Priority Data

Oct. 3, 1997 (FR) .................................................. 97 12344

(51) Int. Cl.$^7$ .................................................. H03K 21/10
(52) U.S. Cl. .................................................. 377/47; 377/48
(58) Field of Search ....................... 377/47, 48; 327/115, 327/117

(56) References Cited

U.S. PATENT DOCUMENTS

| | | | |
|---|---|---|---|
| 4,443,887 | * 4/1984 | Shiramizu | 377/110 |
| 4,648,103 | 3/1987 | Welty et al. | 377/52 |
| 5,172,400 | * 12/1992 | Maemura | 377/116 |
| 6,067,339 | * 5/2000 | Knapp et al. | 377/47 |

OTHER PUBLICATIONS

Patent Abstracts of Japan, vol. 012, No. 469 (E–691), Dec. 8, 1988, JP 63 190424, Aug. 8, 1988.

Patent Abstracts of Japan, vol. 009, No. 075 (E–306), Apr. 4, 1985, JP 59 210729, Nov. 29, 1984.

Patent Abstracts of Japan, vol. 005, No. 171 (E–080), Oct. 30, 1981, JP 56 098030, Aug. 7, 1981.

Patent Abstracts of Japan, vol. 013, No. 113 (E–729), Mar. 17, 1989, JP 63 283316, Nov. 21, 1988.

* cited by examiner

*Primary Examiner*—Tuan T. Lam
(74) *Attorney, Agent, or Firm*—Oblon, Spivak, McClelland, Maier & Neustadt, P.C.

(57) ABSTRACT

The field is that of variable-modulo frequency dividers. To obtain a fast variable-modulo divider over a wide operating range the idea of the invention is to use twin flip-flops (1, 2; 3, 4; 5, 6; 7, 8) for the feedbacks. The benefit of this configuration is that it avoids the use of decoding gates between the flip-flops this increasing the propagation times of the feedback signals.

5 Claims, 4 Drawing Sheets

| INPUTS | | | OUTPUTS | |
|---|---|---|---|---|
| S | CK | D | Q | $\bar{Q}$ |
| H | X | X | H | L |
| L | ↑ | H | H | L |
| L | ↑ | L | L | H |

H: HIGH LEVEL
L: LOW LEVEL

X: UNDETERMINED LEVEL
↑: TRANSITION FROM L TO H

| DIVISION RANK | CONTROLS | | | | |
|---|---|---|---|---|---|
| | d1 | d2 | d3 | d4 | d5 |
| 2 | 0 | 1 | 1 | 1 | 1 |
| 3 | 0 | 0 | 1 | 1 | 1 |
| 4 | 1 | 0 | 1 | 1 | 1 |
| 5 | 1 | 0 | 0 | 1 | 1 |
| 6 | 1 | 1 | 0 | 1 | 1 |
| 7 | 1 | 1 | 0 | 0 | 1 |
| 8 | 1 | 1 | 1 | 0 | 1 |
| 9 | 1 | 1 | 1 | 0 | 0 |
| 10 | 1 | 1 | 1 | 1 | 0 |

1: HIGH LOGIC LEVEL
0: LOW LOGIC LEVEL

FIG.7A *PRIOR ART*

FREQUENCY DIVIDER WITH VARIABLE MODULO

The present invention relates to a variable-modulo frequency divider.

It applies in particular to constructions of frequency synthesizers with high spectral purity using variable-rank dividers operating at high frequencies with low modulos.

Figure 1:
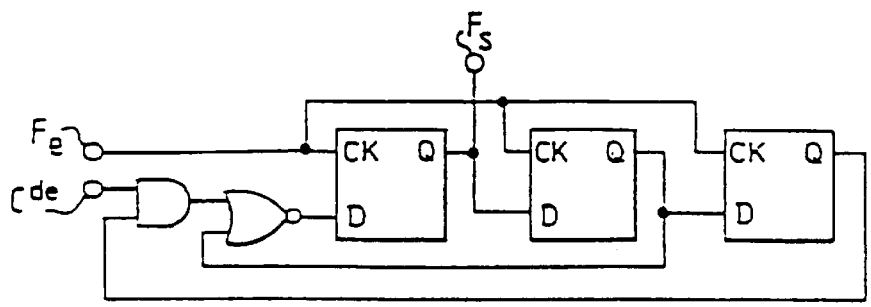

To construct dividers with low division ranks it is known practice to use commercial synchronous counters of the type for example of those marketed under the references 54163 and 10136 respectively by the companies registered in the United States TEXAS INSTRUMENTS and MOTOROLA or to use flip-flops linked in cascade according to the diagram of FIG. 1 which is that of a divider with two modulos 4 and 5 or else according to diagrams adopted in integrated circuits of the type for example of that which is marketed under the reference SP8680 by the company registered in Britain General Electric Company, or else according to patent application JP-A-63-283316.

However, commercial counters and constructions of dividers by means of cascaded flip-flops exhibit limited operation within the high frequencies. This is mainly due, in constructions of the type of those of FIG. 1, to the presence of feedback logic gates which increase the propagation times of the signals between the outputs of the flip-flops and the feedback input of the first flip-flop.

Figure 2:
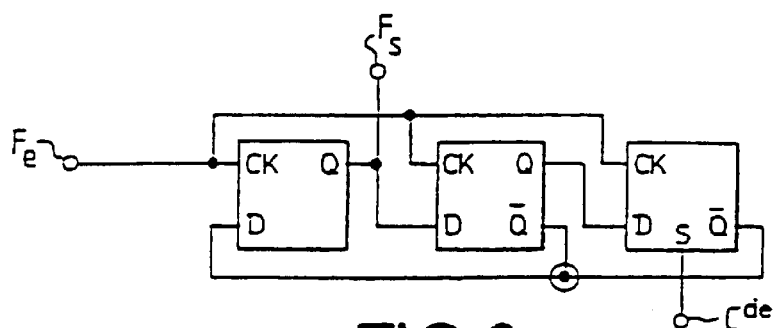

Other types of construction of dividers of the type of that shown in FIG. 2, which is that of a divider with two modulos 4 and 5, also implement cascaded flip-flops. However, unlike in the case of the model of FIG. 1, the feedbacks are not achieved by logic gates but by a hard-wired "OR" circuit constructed by simple connections between outputs of flip-flops and the D input of the first flip-flop making it possible to obviate the propagation times of the signals in the logic gates. This last type of construction makes it possible to obtain higher operating frequencies than the constructions described previously but has the drawback of being limited in the number of achievable division ranks, and in the possible combinations.

Other characteristics and advantages of the invention will become apparent with the aid of the following description, given with regard to the appended drawings which represent:

FIGS. 1 and 2 two embodiments of variable-rank dividers according to the prior art.

Figure 3:
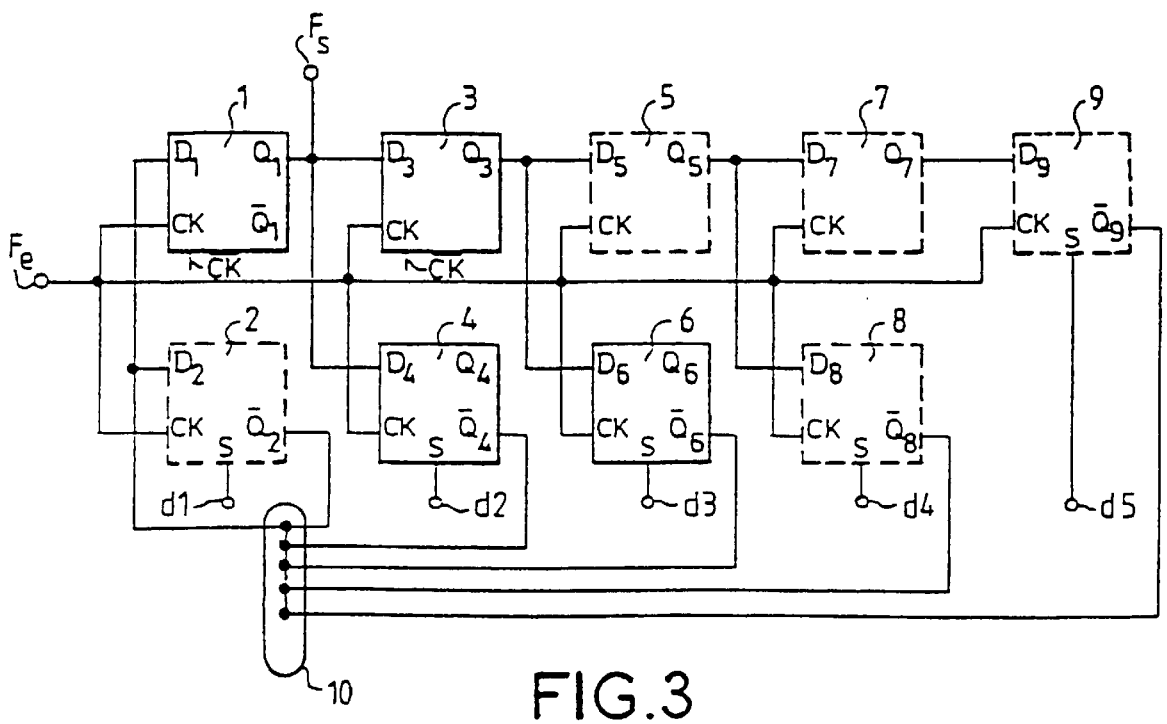

FIG. 3 a schematic diagram of an embodiment of a variable-rank divider according to the invention (modulo 2 to 10).

Figures 4, 5, 6:
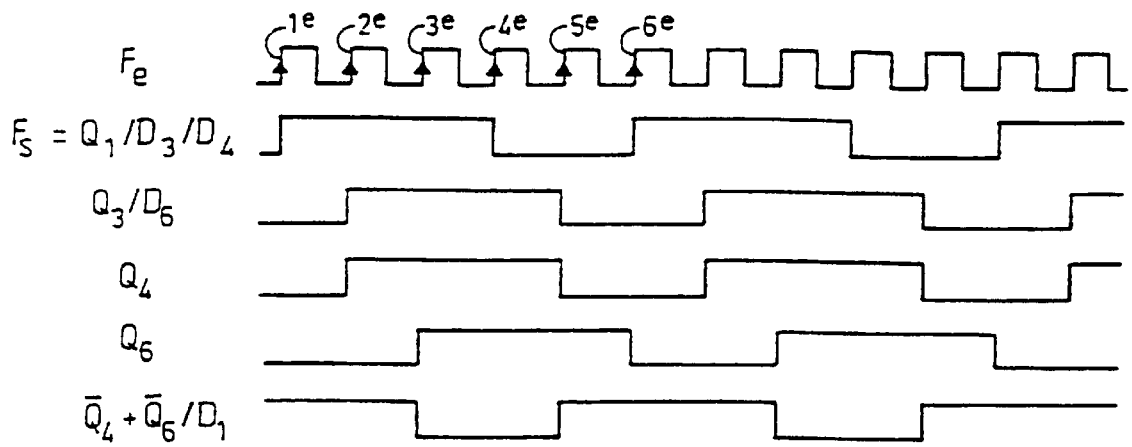
Figure 7B:
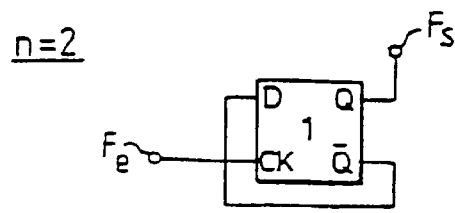
Figure 7B:
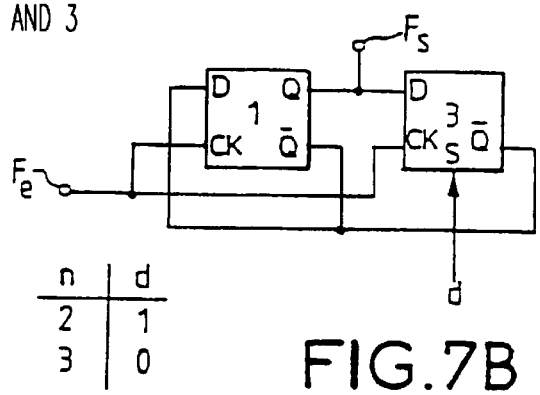
Figure 7C:
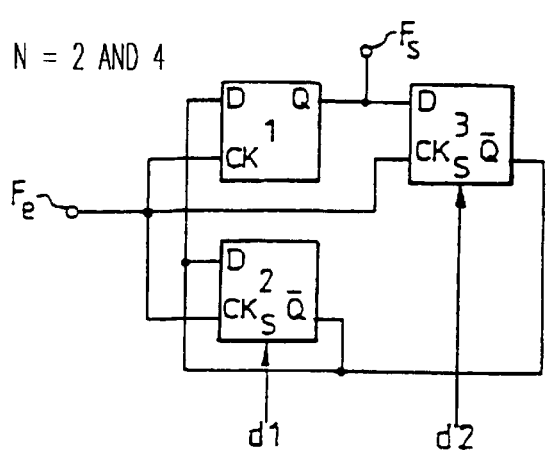
Figure 7D:
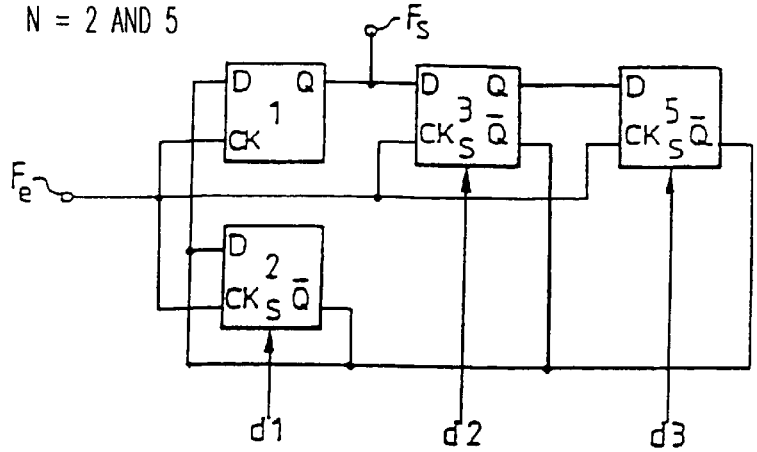
Figure 7E:
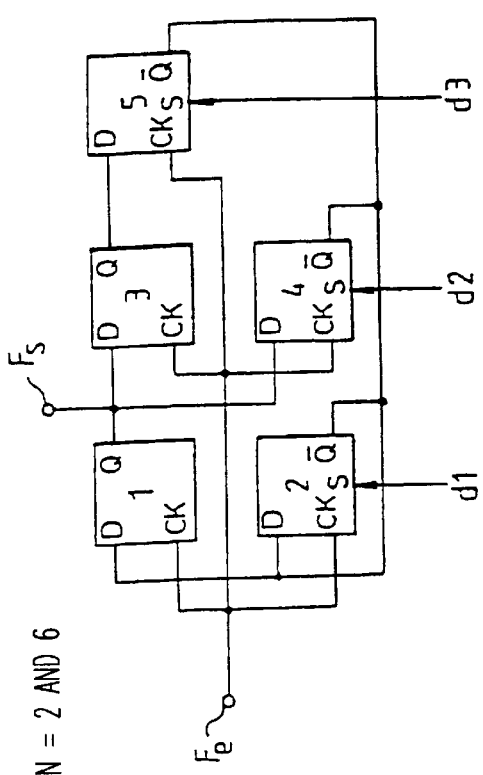
Figure 7F:
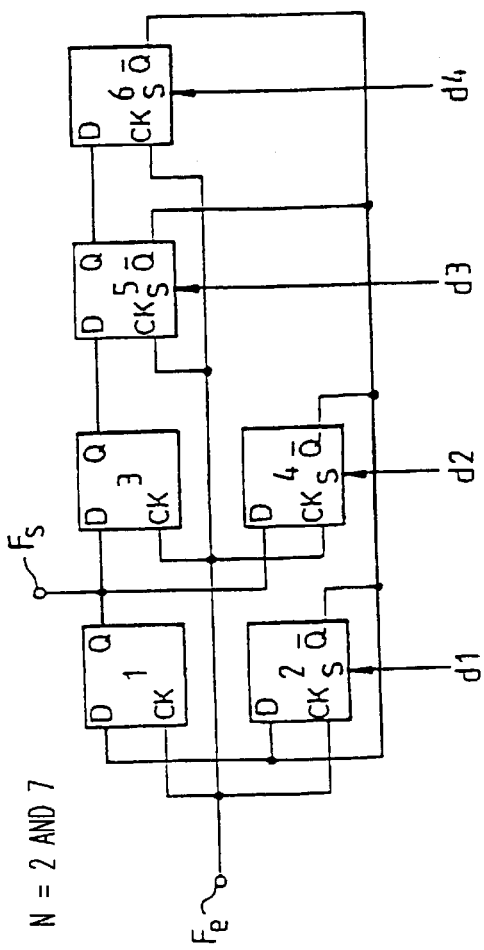

FIG. 4 the truth table of a D type flip-flop involved in the implementation of the diagrams of FIGS. 1, 2, 3, 7A to 7F.

FIG. 5 the timing diagram of the division of rank 5 implemented according to the diagram of FIG. 3.

FIG. 6 a control table for the division ranks of the divider of FIG. 3.

FIGS. 7A to 7F simplified embodiments of dividers according to the invention making it possible to obtain division ranks which can vary by integers lying between 2 and n; n going from 2 to 7.

The divider according to the invention and which is represented in FIG. 3, is more particularly adapted to embodiments in ECL technology where the outputs Q and $\overline{Q}$ of the flip-flops take place via the emitters of the output transistors, but it may also be adapted to other technologies such as TTL technology, for example, to the detriment of the speed. It comprises a first chain of D type flip-flops respectively denoted 1, 3, 5, 7 and 9 linked in cascade, the output Q of one being linked to the D input of the next. Closure of the chain is achieved by connecting the $\overline{Q}$ output of the last flip-flop 9 to the D input of the first 1. With each flip-flop 1, 3, 5 and 7 there is associated respectively a twin flip-flop denoted 2, 4, 6 and 8, the flip-flops of each pair having their D inputs linked together.

The clock inputs $C_K$ of the flip-flops are linked together and to the input $F_e$ of the divider.

The $\overline{Q}$ outputs of the flip-flops 2, 4, 6, 8 and 9 are linked together to form a hard-wired "OR" circuit 10. They are fed back to the D input of the flip-flops 1 and 2. Within the framework of embodiments using TTL logic the $\overline{Q}$ outputs must be linked to a logic "OR" gate with 5 inputs.

The output $F_s$ of the divider is constituted by the output Q of the flip-flop 1.

The division ranks are controlled by inputs $d_1$, $d_2$, $d_3$, $d_4$ and $d_5$ connected respectively to the "SET" inputs denoted S of the flip-flops 2, 4, 6, 8 and 9. The division rank obtained as a function of the controls $d_1$ to $d_5$ is determined according to the table represented in FIG. 6.

To aid the understanding of the diagram every D flip-flop having its S input at 1 is disabled and can be ignored. The same holds true for the odd-numbered flip-flops, associated with the even-numbered flip-flops, counted starting from the last even flip-flop in the ascending order of their reference number which receives a 0 level on its D input, except for flip-flop 1 which must always be retained since it delivers the output signal, and flip-flops 7 and 9 when the S input of flip-flop 9 is at 0.

Thus in the case of division by 5, the flip-flops 2, 8 and 9 can be ignored.

Flip-flops 5 and 7 are ignored since the control input $d_3$ is at zero. The ignored flip-flops are represented dashed in FIG. 3.

The timing diagram for the division by 5 thus carried out is represented in FIG. 5.

In accordance with the array of FIG. 4, the output Q of each flip-flop takes the value of the D input at the moment the clock input $C_K$ switches from "0" (low state) to "1" (high state). In the explanation of the operation which follows it will be kept in mind that the flip-flops are synchronous, that is to say that they are controlled by one and the same clock signal $F_e$ arriving at the inputs $C_K$.

Initially the outputs Q1, Q3, Q4 and Q6 of flip-flops 1, 3, 4 and 6 are at "0"

Q1 applies a "0" state to inputs D3 and D4 of flip-flops 3 and 4

Q3 applies a "0" state to input D6 of flip-flop 6

The logical "OR" $\overline{Q4}+\overline{Q6}$ applies a "1" state to the input D1 of the first flip-flop 1

On the first rising edge of the clock signal $F_e$:

Q1 switches to "1", implying D3 and D4 at "1"

Q3 remains at "0" implying D6 at "1"

Q4 and Q6 remain at "0", $\overline{Q4}+\overline{Q6}$ implying D1 at "1"

On the second rising edge of the clock signal $F_e$:

Q1 remains at "1", implying D3 and D4 at "1"

Q3 and Q4 switch to "1", Q3 implying D6 at "1"

Q6 remains at "0", $\overline{Q6}$ implying D1 at "1"

On the third rising edge of the clock signal $F_e$:

Q1 remains at "1", implying D3 and D4 at "1"

Q3 and Q4 remain at "1", Q3 implying D6 at "1"

Q6 switches to "1", $\overline{Q4}+\overline{Q6}$ implying D1 at "0"

On the fourth rising edge of the clock signal $F_e$:

Q1 switches to "0", implying D3 and D4 at "0"

Q3 and Q4 remain at "1", Q3 implying D6 at "1"

Q6 remains at "1", $\overline{Q4}+\overline{Q6}$ implying D1 at "0"

On the fifth rising edge of the clock signal $F_e$:
  Q1 remains at "0" implying D3 and D4 at "0"
  Q3 and Q4 drop back to "0", Q3 implying D6 at "0", $\overline{Q4}$ implying D1 at "1"
  Q6 remains at "1"

On the sixth rising edge of the clock signal $F_e$:
  Q1 rises back to "1", implying D3 and D4 at "1"
  Q3 and Q4 remain at "0", Q3 implying D6 at "0",
  $\overline{Q4}$ implying D1 at "1"
  Q6 drops back to "0", $\overline{Q6}$ confirming D1 at "1"

At this juncture the divider again has the same states as after the first rising edge of the clock signal $F_e$ and starts off again for a new identical division cycle.

The division rank of a divider according to the invention is not limited in theory.

In general, it is possible, by applying the principle of the invention, to construct any divider going from a rank equal to 2 up to a divider of any rank n>2.

If n is even the number of odd-numbered flip-flops of the first chain is equal to $$\frac{n}{2},$$

the number of even flip-flops of the second chain is equal to $$\frac{n-2}{2}$$

and the $\overline{Q}$ outputs of the even flip-flops of the second chain as well as the last odd-numbered flip-flop of the first chain are connected together.

If n is odd the number of odd-numbered flip-flops of the first chain is equal to $$\frac{n+1}{2},$$

the number of even flip-flops of the second chain is equal to $$\frac{n-3}{2}$$

and the $\overline{Q}$ outputs of the even-numbered flip-flops of the second chain and of the last two odd-numbered flip-flops of the first chain are connected together.

Another possibility consists when n is odd, in using $$\frac{n+1}{2}$$

odd flip-flops in the first chain and $$\frac{n-1}{2}$$

even flip-flops in the second chain by linking together the $\overline{Q}$ outputs of the even flip-flops and of the last odd-numbered flip-flop of the first chain.

This possibility uses one flip-flop more.

Diagrams of dividers according to the invention for division ranks lying between 2 and n, (n going from 2 to 7) together with their control array are represented in FIGS. 7A to 7F.

What is claimed:

1. Variable-modulo frequency divider of the type comprising a first chain of n greater than 3 D type flip-flops (1, 3, 5, 7, 9) linked in cascade, the output Q of one being linked to the input D of the next, and in which the complementary output $\overline{Q}$ of the last flip-flop (9) is fed back to the D input of the first flip-flop (1) by way of an "OR" circuit, characterized in that it comprises a second chain of D type flip-flops (2, 4, 6, 8) comprising a determined number of flip-flops associated respectively with a flip-flop of the first chain (1, 3, 5, 7) the flip-flops of each pair thus formed (1, 2; 3, 4; 5, 6; 7, 8) having the D inputs linked together, in which the complementary outputs $\overline{Q}$ of the flip-flops of the second chain (2, 4, 6, 8) as well as the output $\overline{Q}$ of the last flip-flop of the first chain are linked by the "OR" circuit to the D input of the first flip-flop of the first chain and in which control links ($d_1, d_2 \ldots d_5$) are provided linking the control inputs S for disabling the D flip-flops (2, 4, 6, 8) of the second chain and of the last D flip-flop (9) of the first chain so as to programme the modulo of the divider.

2. Divider according to claim 1, characterized in that it comprises, for carrying out a division modulo 2 to n even, $$\frac{n}{2}$$

flip-flops in the first chain and $$\frac{n-2}{2}$$

flip-flops in the second chain, the complementary output $\overline{Q}$ of the last flip-flop of the first chain and the complementary outputs Q of the flip-flops of the second chain are linked to the D input of the first flip-flops of the even and odd chains by way of the "OR" circuit.

3. Divider according to claim 1, characterized in that it comprises, for carrying a division modulo 2 to n odd, $$\frac{n+1}{2}$$

flip-flops in the first chain and $$\frac{n-3}{2}$$

flip-flops of the second chain, the complementary outputs $\overline{Q}$ of the last two flip-flops of the first chain being linked to the outputs $\overline{Q}$ of the flip-flops of the second chain to the D input of the first flip-flops of the even and odd chains by way of the "OR" circuit.

4. Divider according to claim 1, characterized in that it comprises, for carrying out a division modulo 2 to n odd, $$\frac{n+1}{2}$$

odd flip-flops in the first chain and $$\frac{n-1}{2}$$

even flip-flops of the second chain, by linking together the outputs $\overline{Q}$ of the even flip-flops and of the last odd-numbered flip-flop $\overline{Q}$ of the first chain by way of the "OR" circuit.

5. Divider according to claim 1 for carrying out a division modulo m to n, m<n, n being as large as desired, characterized by a number of flip-flops which in the truth chart of the divider have their disable inputs S always at zero or altering according to the "0" or "1" state, excluding the flip-flops which have their disable input S always 1.

* * * * *